United States Patent [19]

Harwig et al.

[11] Patent Number: 4,504,930
[45] Date of Patent: Mar. 12, 1985

[54] CHARGE-COUPLED DEVICE

[75] Inventors: Hendrik A. Harwig; Jan W. Slotboom; Marcellinus J. M. Pelgrom, all of Eindhoven, Netherlands

[73] Assignee: U.S. Philips Corporation, New York, N.Y.

[21] Appl. No.: 414,109

[22] Filed: Sep. 2, 1982

[30] Foreign Application Priority Data

Sep. 4, 1981 [NL] Netherlands ............... 8104102

[51] Int. Cl.³ ............................................. G11C 13/00
[52] U.S. Cl. .................................. 365/238; 365/183
[58] Field of Search .................. 365/183, 238, 45, 189

[56] References Cited

U.S. PATENT DOCUMENTS 4,228,526 10/1980 Lee ...................................... 365/238

Primary Examiner—Terrell W. Fears
Attorney, Agent, or Firm—Robert T. Mayer; Steven R. Biren

[57] ABSTRACT

The invention relates to a charge-coupled SPS memory comprising a series input register, a parallel section and a series output register. In order to increase the retention time leakage current drain regions are provided beside the memory. Since the charge collected as a result of leakage current is largest during the transport through the outermost registers of the parallel section, only the sides of the parallel section are screened by the said draining regions which preferably consist of dummy registers. FIG. 1.

6 Claims, 9 Drawing Figures

CHARGE-COUPLED DEVICE

The invention relates to a charge-coupled device in the form of an SPS memory comprising a system of juxtaposed parallel registers which are provided at a surface of a common semiconductor body and which form a matrix of memory cells, hereinafter termed parallel section, and which at the inputs are coupled to a common series input register for inputting the information and at the outputs are coupled to a common series output register for reading the information.

SPS memories are generally known, inter alia from the book "Charge Transfer Devices" by C. H. Séquin and M. F. Tompsett, Academic Press Inc. New York, 1975, pp. 243–249. The signals which may be both analog and digital are moved per line into the series input register at a comparatively high speed, are then transported through the parallel section at a comparatively low speed, and are finally read via the series output register at a comparatively high speed. The series registers are usually formed by a 2-phase, 3-phase or 4-phase CCD: the parallel section may also consist of 2, 3 or 4 phase CCD lines, but also of a multiphase system in which an empty place each time occurs among a number of successive full places.

In charge-coupled devices the information which is stored in the form of charge in depletion regions which are induced in the semiconductor body may be lost by leakage currents. As a result of these leakage currents the storage places will be gradually filled with charge carriers so that in the case of digital information a "0" signal can in the long run not or hardly be distinguished from a "1" signal. The storage time (retention time) defined as the time duration in which a signal can be stored without intermediate refreshing operations, is not only determined by the value of the leakage current but also by the dimensions of the MOS capacity in which the signal is stored. According as these dimensions become smaller the MOS capacity will be filled more rapidly and hence the retention time will become smaller. Since the dimensions in LSI and VLSI circuits become smaller and smaller so as to obtain an as large as possible density, it will hence become more and more important to reduce the influence of the leakage currents.

One of the objects of the invention is to increase the retention time in an SPS memory in a simple manner. The invention is based inter alia on the recognition of the fact that the leakage currents as described hereinafter are largest along the edge of the memory and that a considerable improvement can already be obtained by reducing the contribution along the edge.

A charge-coupled device according to the invention is characterized in that two surface regions for draining parasitic charge carriers which flow from the part of the semiconductor body surrounding the memory to the memory are defined in the semiconductor body along the edge of the memory, said surface regions extending substantially only along the edge of the parallel section and on either side thereof. Said surface regions are preferably situated at a distance from the outermost registers of the parallel section which is at most approximately of the same magnitude as the distance between the registers of the parallel section.

A simple embodiment which inter alia has the advantage that no extra process steps are necessary during the manufacture of the device in that the means for draining the leakage currents can be provided by means of the process steps necessary for manufacturing the SPS memory, is characterized in that the said surface periods form part of additional registers extending parallel to the registers of the parallel section in the semiconductor body.

Experiments have demonstrated that an improvement of a factor 2 to 3 can be obtained by draining leakage currents only on the longitudinal sides of the SPS matrix. This is particularly surprising since no provisions have been made on the end faced of the SPS matrix which, as regards length, usually are of the same order of magnitude as the longitudinal sides. This aspect of the invention is therefore of important because the increase of the dissipation as a result of the additional registers beside the parallel section operated with low clock frequency now is at most a few percent but would be much higher as a result of the much higher clock frequency of the series registers when additional draining registers would have to be provided also beside the series registers.

In order to explain the recognition on which the invention is based, the leakage current in a depletion region is distinguished into a component comprising the generation of charge carriers in the depletion region itself and into a diffusion component from the neutral bulk. In general, the first-mentioned component will be predominant at lower temperature (room temperature). During operation, at which the temperature is higher than room temperature (between, for example, 60° C. and 95° C.) the diffusion component may be equal to or larger than the generation in the depletion region and hence be of sufficient interest to be investigated more closely in connection with the desire to increase the retention time of the device.

The diffusion current generally comprises a vertical component and a lateral component. The vertical component is primarily determined by the current density and will have approximately the same value for each storage site. The horizontal (or lateral) component comprises the supply of charge carriers which diffuse into the storage sites from below the field oxide. For storage sites present in the centre of the matrix these contributions are approximately equal to each other and are also determined by the lateral dimension of the field oxide paths which separate the registers of the parallel section from each other. Because the parallel sections are situated at mutually equal distances, these leakage current contributions for storage sites in the centre of the matrix will mutually also be approximately the same.

At the edge the memory matrix is surrounded by a comparatively large region of field oxide. As a result of this, in the absence of leakage current draining means, the lateral component will be considerably higher at the edge than in the centre of the matrix. The diffusion current which flows to the memory on the side of the parallel section lands entirely or at least substantially entirely in the outer most registers. The diffusion current which flows to the memory at the end faces lands for the greater part in the series registers. A signal, for example a logic "0", which is transported from the input to the output via one of the outermost registers of the parallel section is replenished with (lateral) leakage current during the whole time interval. On the contrary, a signal which is transported via a central register is troubled only by the lateral leakage current in the series registers. In the remaining part of the period said leakage current distributes between the other lines. As a result of this the signals which are transported along the outermost registers of the parallel section will experience a larger leakage current than the other signals which are transported via registers which are situated more centrally in the parallel section. By providing, according to the invention, leakage current draining means beside the outermost registers of the parallel section and at small distances herefrom, it is possible to bring the overall leakage current in the outermost registers at approximately the same level as in the centrel registers and hence to obtain a considerable extension of the retention time.

An important improvement can already be obtained when the additional registers have a width which is equally large as that of the registers of the parallel section. Preferably, however, the width of the additional registers is larger, for example a few times larger, than that of the registers of the parallel section.

The invention will now be described in greater detail with reference to an embodiment and the accompanying diagrammatic drawing, in which FIG. 1 is a diagrammatic plan view of an SPS memory according to the invention;

For illustration of the invention an embodiment will be described of an SPS memory having a surface channel of the n-type, but it will be obvious that the invention may be used with the same advantage in devices of the opposite conductivity type and/or devices of the buried channel type.

Figure 2:
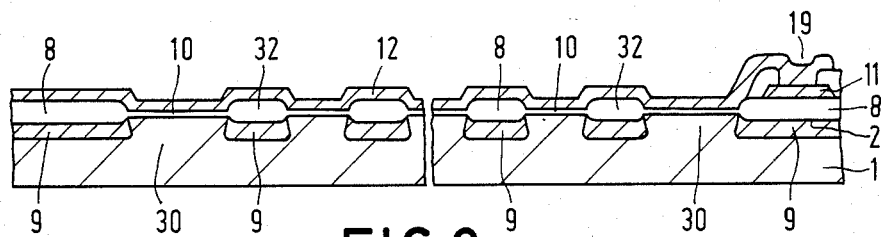
FIG. 2 is a cross-sectional view taken on the line II—II of FIG. 1.
Figure 3:
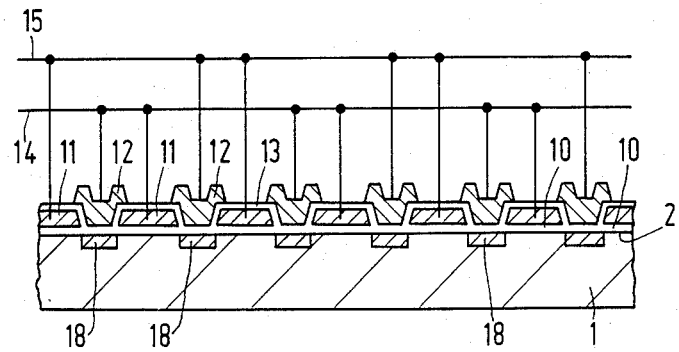
FIG. 3 is a sectional view taken on the line III—III.
Figure 4:
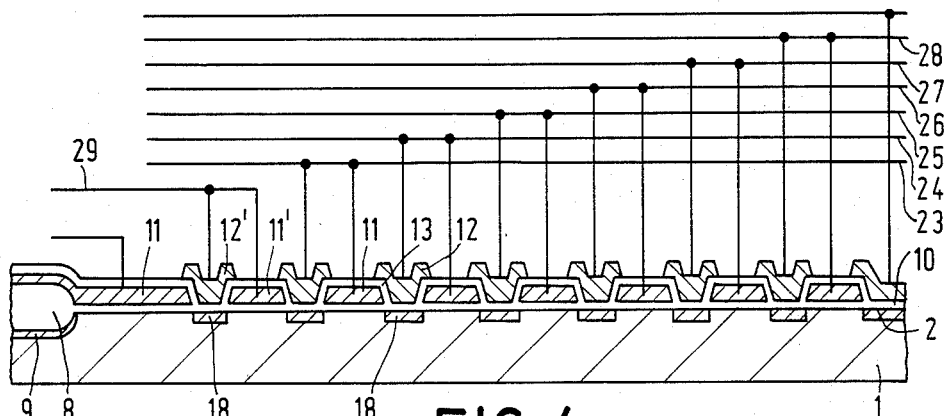
FIG. 4 is a sectional view taken on the line IV—IV.

The device comprises a p-type semiconductor body which in the present example is of p-silicon but which may alternatively be of any other suitable semiconductor material, for example GaAs. The Figures only show the part of the body 1 which comprises the SPS memory matrix. Parts of the semiconductor body in which peripheral electronics, such as generators, have been accommodated are not shown in the drawing for reasons of clarity. As appears from FIGS. 2 to 4 the semiconductor body is of the p-type throughout its thickness. However, in the case in which the memory is composed of charge-coupled devices of the buried channel type, the body 1, as is known, may be provided at its surface 2 with a comparatively thin n-type surface layer. The doping concentration of the body 1 is not critical and may be between approximately $10^{15}$ and $10^{16}$ acceptor atoms per $cm^3$.

Figure 1:
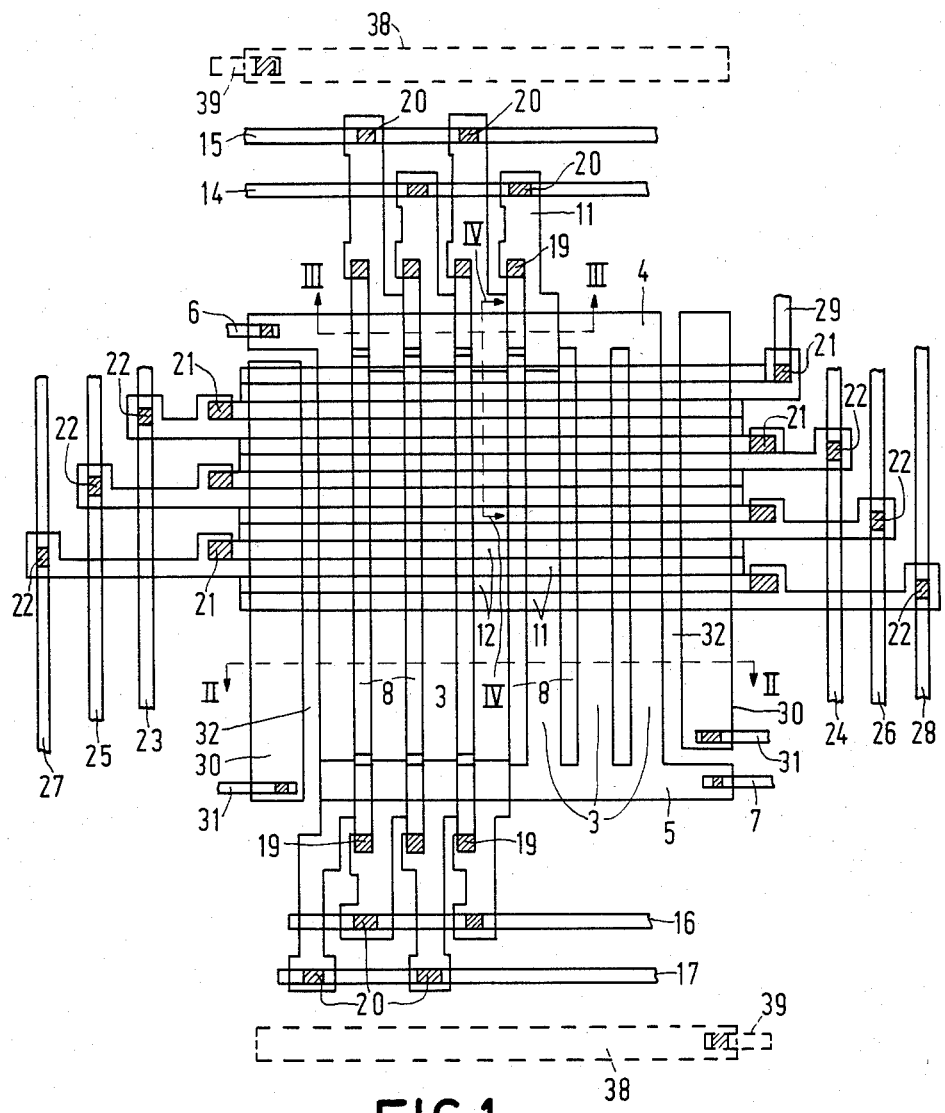

The memory device comprises a number of juxtaposed parallel CCD channels 3 which form the so-called parallel section of the memory. FIG. 1 shows only seven of these channels; actually, however, this number will be much higher and in practical constructions may be a few hundred. The inputs of the channels 3 are coupled to a common series input register 4 and the outputs of the channels 3 are coupled to a common series output register 5. The input register 4 and the output register 5 have input contacts 6 and output contacts 7, respectively, (shown diagrammatically only) for inputting and reading or outputting the information.

The CCD channels 3-5 are defined in the semiconductor body by the comparatively thick field oxide 8 which covers substantially the whole surface of the semiconductor body and, at least in the part of the device shown, has recesses at the area of the CCD channels 3, 4 and 5. Beyond the part shown the field oxide 8 has further apertures, not shown, at the area of the active regions of transistors. The oxide pattern 8 the thickness of which may be, for example, between 0.5 and 1 $\mu m$, in the present example has been obtained by local oxidation of the silicon body, but it may alternatively be obtained in any other known manner. In order to prevent parasitic channel formation the doping concentration below the oxide pattern 8 has been increased by providing channel stopper zones 9. The width of the oxide strips 8 which separate the channels from each other is approximately 2 $\mu m$. The width of the channels 3 themselves is approximately 5 $\mu m$.

At the area of the CCD channels 3-5 the surface of the semiconductor body is covered with a comparatively thin insulating layer 10, for example a silicon oxide layer having a thickness between 0.05 and 0.07 $\mu m$. Provided on the layer 10 are clock electrodes in the form of a two-layer wiring system comprising the electrodes 11 of polycrystalline silicon and the electrodes 12 of, for example, Al (or if desired poly) which are provided between the poly electrodes 11. The electrodes 12 overlap the electrodes 11 in the usual manner and are insulated herefrom by the intermediate oxide layer 13 which may be formed by oxidation of the electrodes 11.

It is to be noted that, for reasons of clarity, the electrodes 11, 12 in the plan view of FIG. 1 are shown to be not overlapping but only juxtaposed.

The series input register 4 and the series output register 5 may be formed by two phase CCDs each having two clock lines 14, 15 and 16, 17, respectively. In order to obtain the asymmetric potential distribution required for 2-phase operation, the doping concentration in the zones 18 below the Al gates 12 is increased by means of an extra p-implantation as a result of which potential barriers are formed below the gates 12 and potential pits are formed below the gates 11 upon applying a voltage to the gates 11 and 12. Of course, the potential distribution desired for 2-phase operation may also be obtained in any other known manner than by an extra p-implantation. The Al gates 12 of the registers 4 and 5 are each connected to the subsequent poly electrodes 11 at the area of the contacts 19, shown shaded in FIG. 1. Furthermore, the poly electrodes 11 are connected to the Al clock lines 14, 15 and 16, 17, respectively, at the area of the shaded contacts 20.

In the parallel section the electrodes may also be grouped for 2-phase operation or, if desired, for 3- or 4-phase operation. In the present embodiment, however, the parallel section is constructed in the form of a so-called multiphase system (or ripple phase) in which each time an empty pit can occur in a number of successive full pits, the empty pit being shifted one place with every clock pulse. In the same manner as in the series registers 4 and 5, the Al gates 12 are each connected to the subsequent poly electrode at the area of the contacts 21, while the p-type implanted zones 18 are formed below the Al gates 12. Each Al-poly combination forms one step in which the region below the poly gates 11 serves a storage site and the region 18 below the Al-gate serves as a potential barrier/transfer region. The poly gates 11 in the parallel section are connected to the Al-clock lines 23-28 via the contacts 22.

FIG. 1 shows only one group of six phases with associated clock lines and it will be obvious that in order to obtain the desired number of elements, the pattern can each time be repeated periodically, the first next Al-poly electrode pair being again coupled to clock line 23, the next pair being coupled to clock line 24, etc. Moreover it will be obvious that the number of phases need not be six but in practical constructions may be higher and may be, for example, ten, with a view to an as large as possible information density.

The first electrode pair, referenced 11', 12', is not connected to one of the clock lines 23-28 but is connected to a separate conductor 29 for driving the transfer of charge packets from the series register 4 to the parallel section 3.

The embodiment described comprises two vertical registers 3 per information unit in the series input register 4 and the series output register 5. This means that each line of information packets should be applied and read, respectively, in two successive steps in which, for example, in the first step the charge packets which are to be stored in the even registers 3 are first inputted in the input register 4 and are transferred to the parallel section, and then the charge packets which are to be stored in the registers having an odd number, are inputted in the input register 4 and the parallel section. In an analogous manner, upon reading, first the packets in the even registers 3 can be transferred in the region 5 and be read and then the packets in the odd registers 3 (interlacing). In connection herewith, an electrode structure having two interdigitating combs may be used for the transfer of the information from the parallel channels 3 to the series output register 5. This electrode configuration, which for clarity is not shown in FIG. 1 and does not form part of the invention, is described inter alia in U.S. Pat. No. 3,967,254.

According to the invention, the device comprises means 30 along the edge of the memory for draining leakage currents and hence increasing the retention time. The means 30 comprise surface regions which are defined in the semiconductor body and which extend substantially only at the edge of the parallel section and are situated at a distance from the immediately juxtaposed CCD channels 3 which is at most approximately equal to the distances between the channels 3 of the parallel section mutually. In the embodiment in which the distance between the CCD channels is determined by the approximately 2 μm wide sunken oxide strips 8, the surface regions 30 and the juxtaposed CCD channels are separated from each other by also approximately 2 μm wide sunken oxide paths 32.

The regions 30 may be formed, if desired, by n-type surface zones which form a p-n junction with the p-type substrate 1. By reversely biasing said p-n junctions, electrons which are present in the proximity of the zones 30 can be captured and drained before they reach a storage site or memory cell in the memory. Because the regions 30 are situated below the clock electrodes 11, 12 and, at least in a self-registering process, could not be provided simultaneously with, for example, the input diodes and output diodes of the series input and output registers 4, 5 a separate doping step would be necessary for providing the regions 30. Therefore, for the regions 30, charge transport channels of additional (dummy) charge-coupled devices are preferably used extending beside the channels 3 of the parallel section. These dummy channels can be manufactured simultaneously with the remaining charge transport registers, so that no extra process steps are necessary. The leakage currents can be captured by the summy channels and be transported in the form of charge packets to an output 31 and be drained there in the manner of the charge transport in the channels 3. In the present embodiment the channels 30 each comprise a separate output contact 31 having an associated output diode, not shown, to which during operation a reverse voltage can be applied. If desired, however, the registers 30 could also be coupled to the series output register 5 in the same manner as the registers 3. In that case the leakage currents may be drained as charge packets via the register 5 and the output contact 7. However, because it is often not desired for a number of non-information-containing signals to occur between the information-containing signals which are derived from the series output register, it is usually recommendable to provide the channels 30 with a separate output 32 as in the embodiment described here.

In order to obtain a good drain the width of the channels 30 has been chosen to be larger than that of the channels 3. A specific value for the width of the channels 3, by way of example, is approximately 5 μm, while a width between approximately 20 μm and 40 μm has been chosen for the channels 32.

Figure 5:
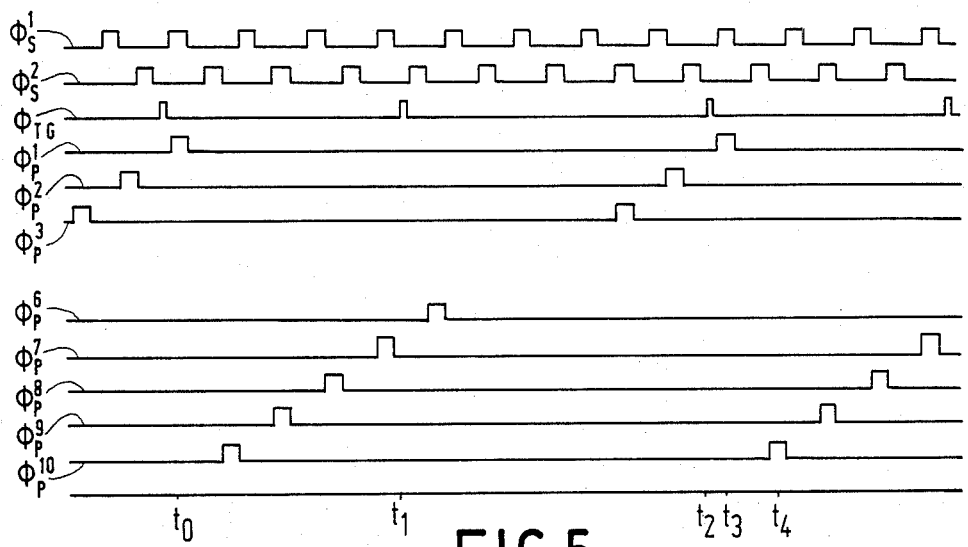
FIG. 5 shows a diagram of clock voltages to be applied during operation.

FIG. 5 shows clock voltages which are applied during operation to an SPS memory of the above-described structure having a width of (only by way of example) 8 lines and a 10-phase system in the parallel section.

Via a contact (not shown in the Figures) a d.c. voltage of $-2.5$ V is applied to the substrate 1. The clock voltages $\phi_s^1$, $\phi_s^2$, $\phi_{TG}$, $\phi_p^1$, $\phi_p^2$, $\phi_p^3$ ... etc. vary between 0 and 5 V, $\phi_s$ and $\phi_s^2$ being the voltages which are applied to the clock lines 14, 15 and the odd and even electrodes, respectively, of the series input register 4, $\phi_{TG}$ being the voltage which is applied via supply line 29 of the transfer electrodes 11', 12', and $\phi_p^1$, $\phi_p^2$, $\phi_p^3$ ... being the clock voltages which are applied to the electrode of the parallel section.

At the indicated voltage values a signal is transferred from a first to a subsequent, second, electrode when a voltage of 5 V is applied to the second electrode. When the second electrode then returns to 0 volts, the charge herebelow remains stored due to the $-2,5$ volts at the substrate as a result of which a depletion zone with an associated potential distribution is induced below the electrodes also at a voltage of 0 volt at the electrodes.

At the instant t0 indicated in FIG. 5 a line of information packets is transferred from the transfer electrode 11', 12' into the first stage of the parallel section by the pulse $\phi_p^1$. Simultaneously, fresh information is applied to the series input register 4. At the instant t1 the series input register 4 is full, which means that all sites having an odd number are occupied. This information is applied below the electrode 11', 12' by the pulse $\phi_{TG}$ at t1 and remains stored below the electrode 11', 12' during the time the series input register is filled anew, until at t2 all even sites in the series input register are occupied. At t2 this information is moved in the still unoccupied sites below the transfer gate 11', 12' by the pulse $\phi_{TG}$. Now a whole row is filled below the gate 11', 12'. In literature this procedure is shown as "interlacing". Simultaneously, the empty row in the multiphase system which succeeds the transfer electrode 11', 12', is present below the first next electrode pair 11, 12 (hereinafter termed 1st electrode pair); empty rows are also present below the 11th, 21st, 21'' electrode pair connected to the 1st electrode pair. The rows below the other electrode pairs (2nd to 10th) are full, that is to say are filled with information.

At t3 the voltage pulse $\phi_p^1$ (+5 V) is applied to the 1st (as well as to the 11th, 21st, etc) electrode pair in the parallel section, as a result of which the row of information packets below the transfer electrodes 11', 12' is transferred to the 1st electrode pair. Simultaneously the rows below the 10th, 20th, 30th, etc. electrode pair are also moved one place so that the empty rows are now present below the 10th, 20th, 30th, etc. electrode pairs.

At t4 the voltage $\phi_p^{10}$ is applied to the 10th, 20th30th electrode pair so that the full rows below the 9th, 19th, 29th electrode pair are moved one place. In this manner the empty place is moved upwards. With suitable choice of the frequency in the multiphase system the row below the 1st electrode pair can be emptied again when the row below the transfer electrode 11', 12' is again full, so that the whole process can be repeated and the information can be written in the memory row by row. It appears from FIG. 5 that for the clock frequencies fs and fp of the series register 4 and the parallel section, respectively, it holds that: fp=(1/N)fs, where N is the number of parallel lines 3.

Figure 6:
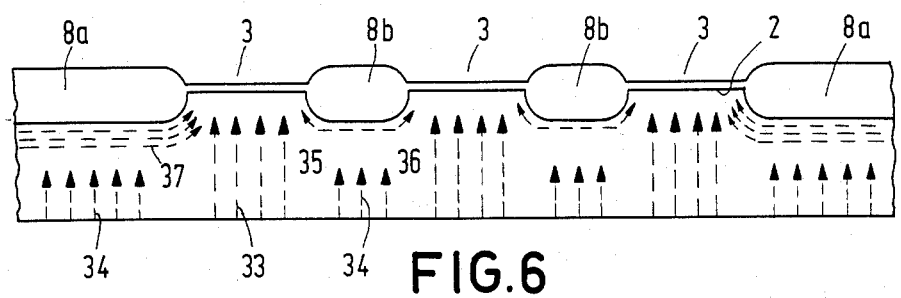
FIG. 6 shows diagrammatically a number of leakage current components in dynamic memory cells.
Figure 7:
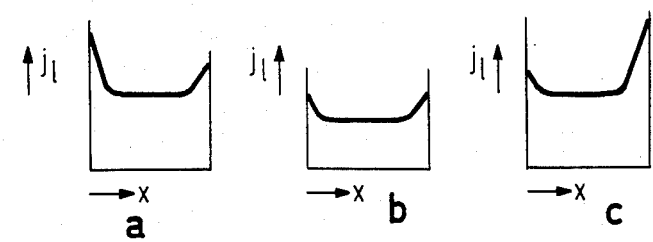
FIG. 7 shows diagrammatically the value of the leakage current in various cells as a function of the distance to the edge of the cells.

In devices of the type described the information is characterized by the presence or absence of electric charge in depletion regions induced locally in the semiconductor body. As already stated in the preamble said potential pits in the depletion regions are gradually filled as a result of leakage currents. From investigations which have led to the invention it has been found that at the normal operating temperatures above 40° C. the diffusion current of charge carriers which are generated in the electric neutral bulk of the semiconductor body in value equalizes or even excels the leakage current which is generated in the depletion regions themselves. In order to explain the effects on which the invention is based, FIG. 6 shows the current profile of the diffusion current in a diagrammatic cross-sectional view of a device having three identical channels 3. At a large distance from the surface 2 the diffusion current which is generated for the greater part on the rear side of the semiconductor body 1 moves substantially from the lower surface to the upper surface. Below the channels 3 the current lines land immediately in the channels 3. Below the field oxide 8, however, the current lines 34 bend in a lateral direction toward the nearest site where charge can be collected. The charge carriers below the very narrow oxide strips 8b in the centre of the parallel section must distribute uniformly between the channels 3 present on either side of the strips 8, as is shown diagrammatically by the arrows 35, 36. Along the edge of the memory the charge carriers will all move to the same nearest memory site (arrow 37). Since said contribution is provided from a large region and all the said charge flows only to one side, the peripheral contribution of the leakage current is comparatively large. FIG. 7 shows diagrammatically the value of the leakage current density as a function of the distance to the edge for two cells at the edge (a and c) and one cell in the centre of the matrix, the cells a and c on the left-hand and on the right-hand side, respectively, adjoining the edge of the matrix where a large leakage current density occurs. The much lower current peaks at the edge of cell b and on the inner edges of the cells a and b are caused by the, lateral, contribution of the field oxide field strips 8b.

The current density at the end faces of the memory (beside the series input and output registers) will be of the same or approximately the same value as at the edge of the parallel section. The influence of the contribution via the edge of the parallel section, however, is much larger than that of the contribution via the end faces of the memory. The last-mentioned component will be captured for the greater part by the series input register 4 and the series output register 5 and as a result of the comparatively high series clock frequency will provide only a small contribution to the leakage current collected in all per charge packet. The leakage current which flows into the memory via the edge of the parallel section will mainly be captured by the outermost registers of the parallel section. The signals which are moved through the parallel section via the outermost registers 3 will be replenished by the said leakage current during the whole transport time in the parallel section. Simultaneously the leakage current distributes via the end faces between the other rows to be written so that the charge collected as a result of leakage current during the transport in the parallel section is dominant.

Figure 8:
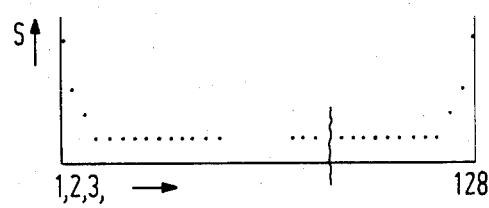
FIG. 8 shows diagrammatically the leakage current in a conventional SPS structure as a function of the distance from the cells to the edge.

FIG. 8 shows for illustration the output signals of 128 bits of information which was inputted in an experimental SPS memory of the above-described structure but without the leakage drain registers 30. The 128 bits which were transported to the output register 5 via the even or odd parallel registers consisted substantially of "0" information, except five "ones" shown in FIG. 8 for reference. The temperature was approximately 95° C. From the Figure it appears that the signals which are transported along the edge of the parallel section experience a much larger leakage current than the signals which are transported via registers situated more inwardly. With a delay time of 10 msec the difference between the "1" and the "0" at the edge often proved to become already undesirably small. The leakage current via the end faces of the register distributes during 10 msec delay time between all the rows of the SPS device and as a result of this has substantially no influence. By providing, as in the example described, the additional registers 30 beside the parallel section, the leakage current level in the outermost registers of the parallel section can be reduced to the same or substantially approximately the same level as in the central registers. The width of the additional registers is preferably chosen to be 3 to 5 times as large as of the registers 3 because, as appears from FIG. 8, in that case substantially the whole lateral diffusion current can be received.

The leakage current in the centre of the parallel section was between $10^{-6}$ and $10^{-7}$ A/cm$^2$ at a temperature of approximately 95° C. This means that after a delay time of 10 msec the storage sites were filled with approximately 10% background charge. For digital information processing this level usually is sufficiently low. In the absence of the dummy channel 30, however, the leakage current gave approximately 50% background charge, which is much too high for the distinction between the "1" and "0" level.

The dummy channels 30 are present substantially only beside the parallel section. The series input and the series output register 4, 5 are therefore not provided with dummy channels so that the overall dissipation is hardly increased. The dissipation per cell is f cv², where f is the clock frequency, C the capacity and V the value of the voltage stroke. Because in a memory of N parallel registers $f_p=(1/N)f_s$ ($f_s$=frequency in the series register), the overall increase of the dissipation in a memory having 256 columns and at the given width of the dummy channels will at most be a few percent. When on the contrary it would have been necessary to provide dummy channels also beside the series registers 4, 5, the overall dissipation as a result of the high clock frequencies of the series registers would substantially be doubled.

In a number of cases it may nevertheless be advantageously to provide leakage current drains at the end faces of the memory, for example, to drain parasitic charge which is generated by impact ionization in the peripheral circuits. In that case, however, it is not necessary to provide the drain at a very short distance (a few μm) from the series registers. FIG. 1 shows such a drain 38 in broken lines present outside the region covered by the clock electrodes and their source connections and clock lines 14, 15. The drain 38 may simply consist of an n type surface zone which forms a p-n junction with the substrate 1 which can be reversely biased by means of the connection 39. The zone 38 may also be provided beside the dummy channels 30, or be constructed as a ring which surrounds the SPS structure.

Figure 9:
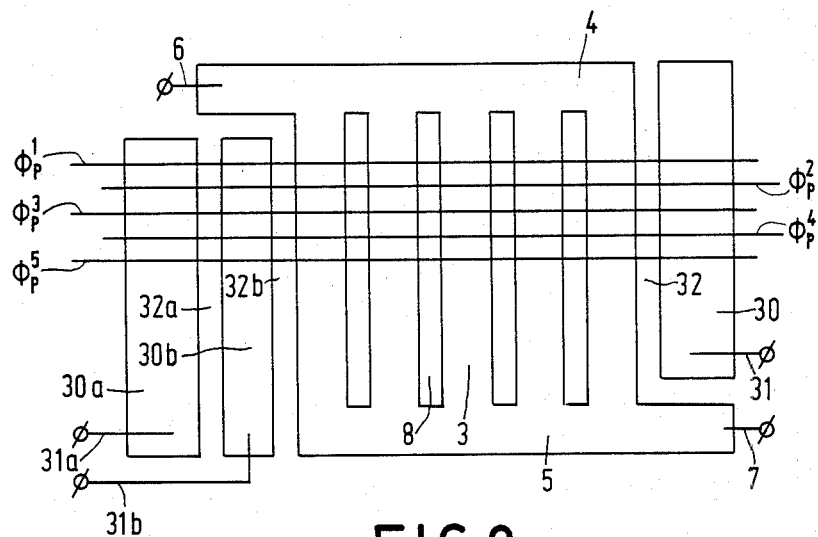
FIG. 9 is a diagrammatic plan view of a modified embodiment of the SPS structure shown in the first embodiment.

FIG. 9 is a diagrammatic plan view of a modified embodiment of the SPS structure described in the first embodiment. The drawing shows diagrammatically the series input register 4, the series output register 5, a few parallel registers 3 with the intermediate sunken oxide strips 8. A few electrodes of the clock electrodes having reference numerals $\phi_p^1$, $\phi_p^2$, $\phi_p^3$ . . . etc. of the parallel section are shown. On the right-hand side of the parallel section, analogously to the preceding embodiment, a dummy channel 30 is provided which is separated from the outermost register 3 by a 2 μm wide oxide strip 32. On the left-hand side the dummy channel is divided into two subchannels, 30a and 30b. The width of the intermediate oxide strips 32a and 32b again is approximately 2 μm. The dummy register 30a the width of which corresponds to the width of the channel 30 on the right-hand side of the parallel section will again receive the greater part of the leakage current originating from the edge during operation which can be drained via the output contact 31a. The dummy register 30b which also has a separate output contact experiences essentially the same leakage current as the registers 3. The signals which are derived from the output 31b may be used as reference ("0" level) upon reading the information-containing signals which are read at the output 7 of the series output register. Of course, the dummy register 30 on the right-hand side of the parallel section may also be divided in this manner.

It will be obvious that the invention is not restricted to the embodiments described, but that many variations are possible to those skilled in the art without departing from the scope of this invention.

For example, the conductivity types in the embodiments described may be reversed. Besides for CCDs having surface transport, the invention may advantageously be used in CCDs having bulk transport (for example, bccd) and in charge transfer devices of the bucket brigade type (bbd).

Instead of a homogeneous p-type substrate, a semiconductor body in the form of a weakly doped p-type epitaxial layer on a more strongly doped (p+) substrate may also be used in which the leakage current level is already considerably reduced as a result of the higher doping in the substrate.

What is claimed is:

1. A charge-coupled device in the form of an SPS memory comprising a system of juxtaposed parallel registers which are provided at a surface of a common semiconductor body and which form a matrix of memory cells, hereinafter termed parallel section, and which at the inputs are coupled to a common series input register for inputting the information, and at the outputs are coupled to a common series output register for reading the information, characterized in that two surface regions for draining parasitic charge carriers which flows from the part of the semiconductor body surrounding the memory to the memory are defined in the semiconductor body along the edge of the memory, the said surface regions extending substantially only along the edge of the parallel section and on either side thereof, and that the said surface regions are situated at a distance from the outermost registers of the parallel section which is at most approximately of the same value as the distance between the registers of the parallel section.

2. A charge-coupled device as claimed in claim 1, characterized in that the said surface regions form part of additional registers extending parallel to the registers of the parallel section in the semiconductor body.

3. A charge-coupled device as claimed in claim 2, characterized in that the said additional registers have separate output contacts.

4. A charge-coupled device as claimed in claim 2 or 3, characterized in that the width of the additional registers is larger than that of the registers of the parallel section.

5. A charge-coupled device as claimed in claim 1, 2 or 3, characterized in that at least one of the outermost registers has a separate output for deriving a reference signal.

6. A charge-coupled device as claimed in claim 1, 2 or 3, characterized in that in the semiconductor body further surface regions are defined for draining leakage currents, which further surface regions extend beside and parallel to the series registers in the semiconductor body and which are present at a distance from the series registers which is larger than the distance between the first-mentioned surface regions and the outermost registers of the parallel section.

* * * * *

UNITED STATES PATENT AND TRADEMARK OFFICE
CERTIFICATE OF CORRECTION

PATENT NO. : 4,504,930
DATED : March 12, 1985
INVENTOR(S) : HENDRIK A. HARWIG ET AL Page 1 of 12

It is certified that error appears in the above-identified patent and that said Letters Patent is hereby corrected as shown below:

Section [54] IN THE TITLE:

Delete in its entirety and insert

--CHARGE-COUPLED SPS MEMORY DEVICE--.

Section [57] ABSTRACT:

delete in its entirety and insert as a centered heading: --ABSTRACT OF THE DISCLOSURE--;

line 2, change "comprising " to --having--;

line 4, after "time" insert --,-- (comma);

line 9, delete "said"; after "regions" insert

--,-- (comma);

line 11, delete "Fig. 1".

UNITED STATES PATENT AND TRADEMARK OFFICE
CERTIFICATE OF CORRECTION

PATENT NO. : 4,504,930
DATED : March 12, 1985
INVENTOR(S) : HENDRIK A. HARWIG ET AL It is certified that error appears in the above-identified patent and that said Letters Patent is hereby corrected as shown below:

IN THE SPECIFICATION:

Column 1, before line 1, insert --BACKGROUND OF THE

INVENTION--;

line 16, before "." (period) insert --and Proc.

JEDM Washington, 1977, pp. 254-257--;

after "signals" and "digital" insert

--,-- (comma);

Line 23, change ":" to --;-- (semicolon);

line 25, delete " each time";

line 33, delete "not or";

line 39, change "According as" to --As--;

UNITED STATES PATENT AND TRADEMARK OFFICE
CERTIFICATE OF CORRECTION

PATENT NO. : 4,504,930

DATED : March 12, 1985

INVENTOR(S) : CHARGE-COUPLED DEVICE

It is certified that error appears in the above-identified patent and that said Letters Patent is hereby corrected as shown below:

Column 1, line 43, change "an as large as" to --the largest--;

between lines 46 & 47, insert as a centered heading: --SUMMARY OF THE INVENTION--;

line 52, delete "already".

Column 2, line 11, change "faced" to --faces--;

line 14, delete "of";

line 17, after "cent" insert --,-- (comma);

line 19, change "when" to --if--;

line 20, change "would have to be" to --were also-- and delete "also";

line 24, change "distinguished" to --divided--;

line 31, before "the" insert --,-- (comma);

UNITED STATES PATENT AND TRADEMARK OFFICE
CERTIFICATE OF CORRECTION

PATENT NO. : 4,504,930
DATED : March 12, 1985
INVENTOR(S) : HENDRIK A. HARWIG ET AL It is certified that error appears in the above-identified patent and that said Letters Patent is hereby corrected as shown below:

Column 2, line 43, change "centre" to --center--;

lines 49 & 55, change "centre" to --center--;

line 50, delete "mutually";

line 51, after "edge" insert --1-- (comma);

line 58, change "outer most" to --outermost--.

Column 3, line 8, change "herefrom" to --therefrom--;

line 10, change "at" to --to--;

change "centrel" to --central--;

line 13, delete "already";

between lines 18 & 19, insert as a centered heading: --BRIEF DESCRIPTION OF THE DRAWING--;

UNITED STATES PATENT AND TRADEMARK OFFICE
CERTIFICATE OF CORRECTION

PATENT NO. : 4,504,930

DATED : March 12, 1985

INVENTOR(S) : HENDRIK A. HARWIG ET AL

It is certified that error appears in the above-identified patent and that said Letters Patent is hereby corrected as shown below:

Column 3, line 21, after "which" insert --:-- (colon);

line 37, after "edge;" insert --and--;

between lines 40 & 41, insert as a centered heading: --DESCRIPTION OF THE PREFERRED EMBODIMENTS--;

line 41, after "invention" insert --,-- (comma);

line 44, change "obvious" to --apparent--;

line 55, after "4" insert --,-- (comma).

Column 4, line 13, after "shown" insert --,-- (comma);

line 15, after "8" insert --,-- (comma);

line 20, after "formation" insert --,-- (comma);

line 36, change "herefrom" to --therefrom--;

UNITED STATES PATENT AND TRADEMARK OFFICE
CERTIFICATE OF CORRECTION

PATENT NO. : 4,504,930

DATED : March 12, 1985

INVENTOR(S) : HENDRIK A. HARWIG ET AL

It is certified that error appears in the above-identified patent and that said Letters Patent is hereby corrected as shown below:

Column 4, line 36, change "herefrom" to --therefrom--;

line 47, after "p-implantation" insert

--,-- (comma);

line 59, after "section" insert --,-- (comma);

line 63, delete "system";

before "in" insert --system--;

delete "each time".

Column 5, line 9, change "obvious" to --apparent--;

line 11, delete " each time";

line 14, change "obvious" to --apparent--;

after "need" insert --may--;

line 36, after "read" insert --,-- (comma);

line 37, before "." (period) insert --can be processed--.

UNITED STATES PATENT AND TRADEMARK OFFICE
CERTIFICATE OF CORRECTION

PATENT NO. : 4,504,930
DATED : March 12, 1985
INVENTOR(S) : HENDRIK A. HARWIG ET AL It is certified that error appears in the above-identified patent and that said Letters Patent is hereby corrected as shown below:

Column 5, line 53, delete "mutually";

line 56, after "are" insert --also--;

and delete "also".

Column 6, line 1, after "5" insert --,-- (comma);

line 9, change "summy" to --dummy-- and delete "b e";

line 24, change "recommendable" to --advisable--;

line 27, after "drain" insert --,-- (comma);

line 47, after "values" insert --,-- (comma);

line 51, change "herebelow" to --therebelow--;

change " -2,5 " to -- -2.5 --;

line 52, after "substrate" insert --,-- (comma);

UNITED STATES PATENT AND TRADEMARK OFFICE
CERTIFICATE OF CORRECTION

PATENT NO. : 4,504,930

DATED : March 12, 1985

INVENTOR(S) : HENDRIK A. HARWIG ET AL

It is certified that error appears in the above-identified patent and that said Letters Patent is hereby corrected as shown below:

Column 6, line 55, after "5" insert --,-- (comma);

line 68, after "In" insert --the--.

Column 7, line 6, change "21" to --etc.--;

line 11, change "etc" to --etc.--;

line 27, change "appears" to --can be seen--;

line 31, after "described" insert --,-- (comma);

line 34, change "in the preamble" to --above--;

line 41, change "excels" to --exceeds--;

line 47, after "2" insert --,-- (comma);

line 51, after "3" insert --,-- (comma);

lines 55 & 56, change "centre" to --center--.

UNITED STATES PATENT AND TRADEMARK OFFICE
CERTIFICATE OF CORRECTION

PATENT NO. : 4,504,930
DATED : March 12, 1985
INVENTOR(S) : HENDRIK A. HARWIG ET AL It is certified that error appears in the above-identified patent and that said Letters Patent is hereby corrected as shown below:

Column 8, lines 3 & 4, delete "," (both occurrences);

line 16, change "packet" to --packets--;

line 34, before "five" insert --for--;

line 40, change "msec" to --msec.,--;

line 42, change "became already" to --be--;

line 43, after "during" insert --the--;

line 44, change "msec" to --msec.--;

after "device" insert --,-- (comma);

line 55, change "centre" to --center--;

line 58, change "msec" to --msec.--;

line 63, change "the " to --a--.

UNITED STATES PATENT AND TRADEMARK OFFICE
CERTIFICATE OF CORRECTION

PATENT NO. : 4,504,930
DATED : March 12, 1985
INVENTOR(S) : HENDRIK A. HARWIG ET AL It is certified that error appears in the above-identified patent and that said Letters Patent is hereby corrected as shown below:

Column 9, line 7, delete "When";

line 8, change "on" to --If, to--;

after "contrary" insert --,-- (comma);

change "have been" to --be--;

line 14, change "geously" to --geous--;

line 33, change "a few" to --several--;

line 35, change "A few" to --Several--;

line 38, change "analoguously" to --analogous--;

line 44, after "30a" insert --,-- (comma);

line 46, after "section" insert --,-- (comma);

line 49, after "30b" insert --,-- (comma);

UNITED STATES PATENT AND TRADEMARK OFFICE
CERTIFICATE OF CORRECTION

PATENT NO. : 4,504,930
DATED : March 12, 1985
INVENTOR(S) : HENDRIK A. HARWIG ET AL It is certified that error appears in the above-identified patent and that said Letters Patent is hereby corrected as shown below:

Column 9, line 50, after "contact" insert --,-- (comma);

line 59, change "obvious" to --apparent--.

Column 10, line 4, change "Besides for" to --In addition to--;

line 10, change "weakly doped" to --weakly-doped--;

line 11, change "strongly doped" to

--strongly-doped--.

IN THE CLAIMS:

Claim 1, line 1, change "in the form of" to --having--;

line 5, delete "and';

line 10, change "flows" to --flow--;

line 13, delete "the"(second occurrence);

UNITED STATES PATENT AND TRADEMARK OFFICE
CERTIFICATE OF CORRECTION

PATENT NO. : 4,504,930

DATED : March 12, 1985

INVENTOR(S) : HENDRIK A. HARWIG ET AL

It is certified that error appears in the above-identified patent and that said Letters Patent is hereby corrected as shown below:

Claim 1, line 15, delete "the";

line 18, delete "of" and delete "value".

Claim 2, line 2, delete "the".

Claim 3, line 2, delete "the".

Signed and Sealed this

Ninth Day of December, 1986

Attest:

DONALD J. QUIGG

Attesting Officer

Commissioner of Patents and Trademarks